US012699416B2

(12) United States Patent
Shenoi

(10) Patent No.: US 12,699,416 B2
(45) Date of Patent: Aug. 4, 2026

(54) ENHANCED HYBRID CLOCK

(71) Applicant: QULSAR, INC., San Jose, CA (US)

(72) Inventor: Kishan Shenoi, San Jose, CA (US)

(73) Assignee: Viavi Solutions, Inc., Chandler, AZ (US)

( * ) Notice: Subject to any disclaimer, the term of this patent is extended or adjusted under 35 U.S.C. 154(b) by 25 days.

(21) Appl. No.: 19/105,014

(22) PCT Filed: Sep. 28, 2023

(86) PCT No.: PCT/US2023/033998
§ 371 (c)(1),
(2) Date: Feb. 19, 2025

(87) PCT Pub. No.: WO2024/072977
PCT Pub. Date: Apr. 4, 2024

(65) Prior Publication Data
US 2025/0284309 A1     Sep. 11, 2025

Related U.S. Application Data

(60) Provisional application No. 63/411,393, filed on Sep. 29, 2022.

(51) Int. Cl.
*G06F 1/08*     (2006.01)
*H03L 7/099*     (2006.01)

(52) U.S. Cl.
CPC .............. *G06F 1/08* (2013.01); *H03L 7/0991* (2013.01)

(58) Field of Classification Search
None
See application file for complete search history.

(56) References Cited

U.S. PATENT DOCUMENTS

| | | | | | |
|---|---|---|---|---|---|
| 9,369,270 | B1 * | 6/2016 | Spijker | ................. | H04J 3/0667 |
| 9,444,470 | B2 * | 9/2016 | Milijevic | .................. | H03L 7/22 |
| 9,673,970 | B1 * | 6/2017 | Aweya | .............. | H04W 56/0035 |
| 10,164,646 | B1 * | 12/2018 | Lu | .......................... | H03L 7/0992 |

OTHER PUBLICATIONS

Wensi Zhu "Study and Implementation of IEEE 1588 Precise Time Protocol" Tampere University of Technology, Sep. 10, 2013 87 Pgs.
Jack A. Stone and Patrick egan "An Optical Frequency Comb Tied to GPS for Laser Frequency/Wavelength Calibration" National institute of Standards and Technology vol. 115, No. 6, Nov.-Dec. 2010 19 Pgs.
International Search Report & Written Opinion dated Feb. 7, 2024 for International Application PCT/US2023/033998.

* cited by examiner

*Primary Examiner* — Cassandra F Cox
(74) *Attorney, Agent, or Firm* — Farjami & Farjami LLP

(57)     ABSTRACT

A subordinate clock includes a first servo loop, a second servo loop, and a third servo loop, each include a respective digitally controlled oscillator (DCO). The first DCO receives (i) a first error signal that is associated with a physical layer reference signal and (ii) an oscillating signal and outputs a physical layer clock signal. The second DCO receives (i) a second error signal associated with the physical layer clock signal and (ii) the oscillating signal and outputs an intermediate clock signal. The third DCO receives (i) a third error signal associated with a grandmaster reference signal generated by a grandmaster clock and (ii) the intermediate clock signal and outputs a final clock signal with an average frequency that is generally equal to an average frequency of the grandmaster reference signal.

22 Claims, 11 Drawing Sheets

ENHANCED HYBRID CLOCK

CROSS-REFERENCE TO RELATED APPLICATIONS

This is a U.S. national phase application, which is based on, and claims priority from, PCT application Serial No. PCT/US2023/033998, filed Sep. 28, 2023, which is based on, and claims priority from, which claims the benefit of, and priority to, U.S. Provisional Patent Application No. 63/411,393, filed on Sep. 29, 2022, which are hereby incorporated by reference herein in their entirety.

TECHNICAL FIELD

Embodiments of the present invention relate generally to timing systems, and more specifically, to methods and apparatus for achieving hybrid clock operation within timing systems.

BACKGROUND

Packet-based timing methods are becoming essential for delivering timing over packet-switched networks, often referred to as the cloud. New systems and methods for enabling clocks to utilize multiple references are needed.

SUMMARY

According to a first implementation of the present disclosure, a subordinate clock comprises a first servo loop, a second servo loop, and a third servo loop. The first servo loop includes a first digitally controlled oscillator (DCO) that is configured to receive (i) a first error signal that is associated with a physical layer reference signal and (ii) an oscillating signal, and to output a physical layer clock signal. The second servo loop includes a second DCO that is configured to receive (i) a second error signal associated with the physical layer clock signal and (ii) the oscillating signal, and to output an intermediate clock signal. The third servo loop includes a third DCO that is configured to receive (i) a third error signal associated with a grandmaster reference signal generated by a grandmaster clock and (ii) the intermediate clock signal, and to output a final clock signal. An average frequency of the final clock signal is generally equal to an average frequency of the grandmaster reference signal.

In some aspects of the first implementation, each of the servo loops has a phase-locked loop structure.

In some aspects of the first implementation, the first servo loop includes a first comparator configured to receive (i) the physical layer reference signal and (ii) the physical layer clock signal from the first DCO, and to output the first error signal. In some aspects of the first implementation, the first error signal is associated with a difference between the physical layer reference signal and the physical layer clock signal.

In some aspects of the first implementation, the second servo loop includes a second comparator configured to receive (i) the physical layer clock signal and (ii) the intermediate clock signal from the second DCO, and to output the second error signal.

In some aspects of the first implementation, the second error signal is associated with a difference between the physical layer clock signal and the intermediate clock signal.

In some aspects of the first implementation, the third servo loop includes a third comparator configured to receive (i) the grandmaster reference signal and (ii) the final clock signal from the third DCO, and to output the third error signal.

In some aspects of the first implementation, the third error signal is indicative of an offset between a time of the grandmaster clock and a time of the subordinate clock.

In some aspects of the first implementation, the first servo loop has a frequency bandwidth and (i) attenuates noise associated with the physical layer reference signal that is above the frequency bandwidth of the first servo loop, and (ii) attenuates noise associated with the oscillating signal that is below the frequency bandwidth of the first servo loop.

In some aspects of the first implementation, the frequency bandwidth of the first servo loop is between about 1 Hz and about 10 Hz, between about 3 Hz and about 10 Hz, or about 3 Hz.

In some aspects of the first implementation, the second servo loop has a frequency bandwidth and (i) attenuates the noise associated with the physical layer reference signal that is above the frequency bandwidth of the second servo loop, and (ii) attenuates the noise associated with the oscillating signal that is below the frequency bandwidth of the second servo loop.

In some aspects of the first implementation, the frequency bandwidth of the second servo loop is between about 0.01 Hz and about 0.1 Hz, about 0.1 Hz, or about 0.01 Hz.

In some aspects of the first implementation, the third servo loop has a frequency bandwidth and (i) attenuates noise associated with the grandmaster reference signal that is above the frequency bandwidth of the third servo loop, and (ii) attenuates the noise associated with the physical layer reference signal that is below the frequency bandwidth of the third servo loop.

In some aspects of the first implementation, the frequency bandwidth of the third servo loop is between about 0.05 Hz and about 0.1 Hz or about 0.1 Hz.

In some aspects of the first implementation, the physical layer reference signal is a signal generated by a Synchronous Optical Networking (SONET) transmission link, a signal generated by a Synchronous Digital Hierarchy (SDH) transmission link, a signal generated by a Synchronous Ethernet (SyncE) transmission link, or a timing input from a Building Integrated Timing Supply (BITS) system, and wherein the grandmaster reference signal is Precision Time Protocol (PTP) timing input signal.

In some aspects of the first implementation, the third servo loop operates to drive an offset between a time of the subordinate clock and a time of the grandmaster clock to zero or to a prescribed constant value.

According to a second implementation of the present disclosure, a timing system comprises a grandmaster clock, a physical layer, and a subordinate clock. The grandmaster clock is configured to generate a grandmaster reference signal associated with a time of the grandmaster clock. The physical layer is configured to generate a physical layer reference signal associated with a frequency of the physical layer. The subordinate clock includes a first servo loop, a second servo loop, and a third servo loop. The first servo loop includes a first digitally controlled oscillator (DCO) that is configured to receive (i) a first error signal that is associated with the physical layer reference signal and (ii) an oscillating signal, and to output a physical layer clock signal. The second servo loop includes a second DCO that is configured to receive (i) a second error signal associated with the physical layer clock signal and (ii) the oscillating signal, and to output an intermediate clock signal. The third servo loop includes a third DCO that is configured to receive (i) a third error signal associated with a grandmaster reference signal generated by the grandmaster clock and (ii) the intermediate clock signal, and to output a final clock signal. An average frequency of the final clock signal is generally equal to an average frequency of the grandmaster reference signal.

In some aspects of the second implementation, the second servo loop attenuates noise associated with the physical layer reference signal that is above a frequency bandwidth of the second servo loop, the frequency bandwidth of the second servo loop being between about 0.01 Hz and about 0.1 Hz.

In some aspects of the second implementation, the first servo loop has a frequency bandwidth of between about 1 Hz, and about 10 Hz, and (i) attenuates noise associated with the physical layer reference signal that is above the frequency bandwidth of the first servo loop, and (ii) attenuates noise associated with the oscillating signal that is below the frequency bandwidth of the first servo loop.

In some aspects of the second implementation, the second servo loop has a frequency bandwidth of between about 0.01 Hz and about 0.1 Hz, and (i) attenuates the noise associated with the physical layer reference signal that is above the frequency bandwidth of the second servo loop, and (ii) attenuates the noise associated with the oscillating signal that is below the frequency bandwidth of the second servo loop.

In some aspects of the second implementation, the third servo loop has a frequency bandwidth of between about 0.05 Hz and about 0.1 Hz, and (i) attenuates noise associated with the grandmaster reference signal that is above the frequency bandwidth of the third servo loop, and (ii) attenuates the noise associated with the physical layer reference signal that is below the frequency bandwidth of the third servo loop.

In some aspects of the second implementation, the third servo loop operates to drive an offset between a time of the subordinate clock and a time of the grandmaster clock to zero or to a prescribed constant value.

The above summary is not intended to represent each implementation or every aspect of the present disclosure. Additional features and benefits of the present disclosure are apparent from the detailed description and figures set forth below.

BRIEF DESCRIPTION OF THE DRAWINGS

FIG. 7A shows the combined frequency response characteristics of the first servo loop and the second servo loop of the subordinate clock of FIG. 4, according to aspects of the present disclosure.

Figure 1:
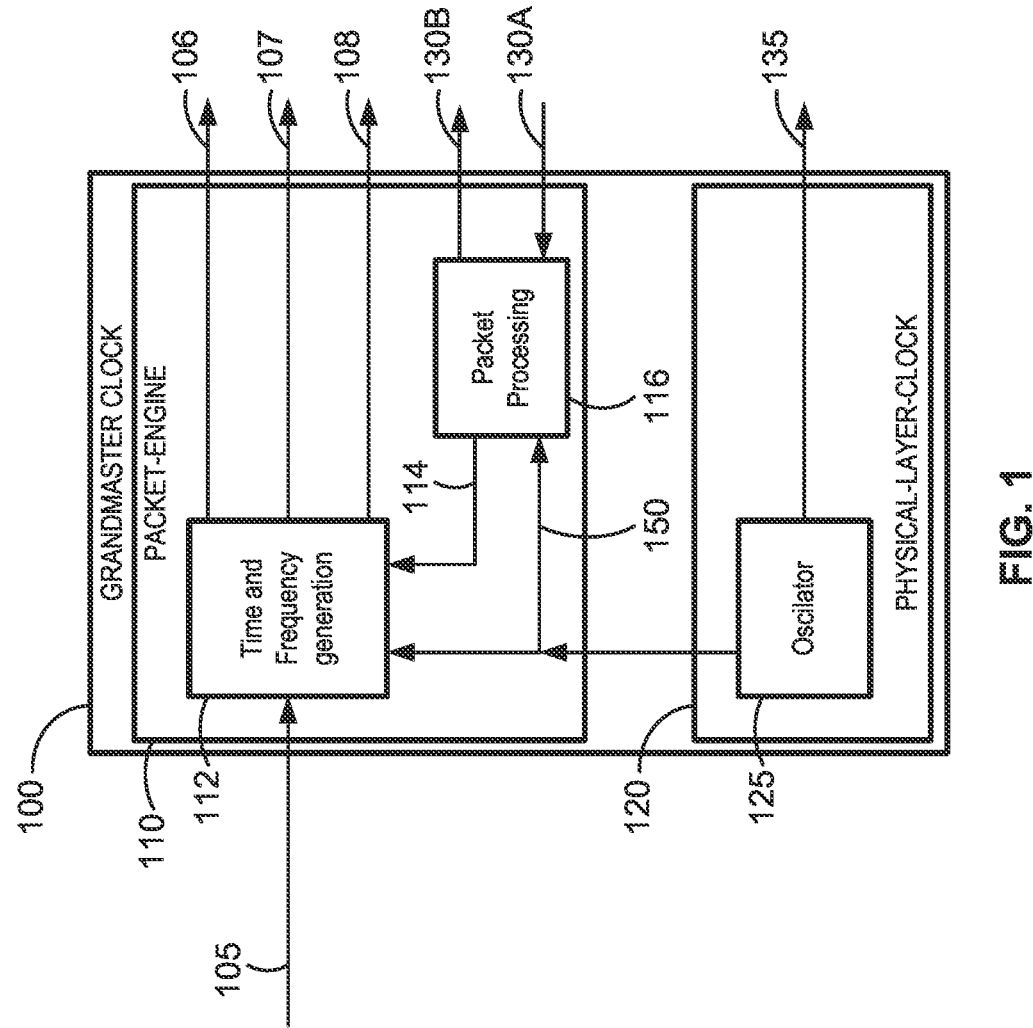
FIG. 1 is a conceptual diagram that depicts functional blocks of a PTP Grandmaster clock, according to aspects of the present disclosure.

While the present disclosure is susceptible to various modifications and alternative forms, specific implementations and embodiments thereof have been shown by way of example in the drawings and will herein be described in detail. It should be understood, however, that it is not intended to limit the present disclosure to the particular forms disclosed, but on the contrary, the present disclosure is to cover all modifications, equivalents, and alternatives falling within the spirit and scope of the present disclosure as defined by the appended claims.

DETAILED DESCRIPTION

Precision Timing Protocol (PTP) is often used as a standard for delivering timing information (time/phase/frequency) from a grandmaster (GM) clock (sometimes referred to as a grandmaster clock or a grandmaster) to subordinate clocks in end application-specific equipment, such as wireless base stations providing mobile telephony services that require precise timing and the backhaul method of choice is Ethernet.

The grandmaster clock provides timing information over the packet-switched network to the subordinate clocks by exchanging packets with embedded time-stamps related to the time-of-arrival and time-of-departure of the timing packets. The subordinate clock utilizes this information to align its time (and frequency of its time-clock) with the grandmaster clock. The grandmaster clock is provided an external reference to serve as the basis for time and often frequency as well. Most commonly this reference is derived from a Global Navigation Satellite System (GNSS) such as the global positioning system (GPS) System that in turn is controlled by the US Department of Defense and its timing controlled very precisely and linked to the US Naval Observatory. Time alignment to the GPS clock is, for all practical purposes, equivalent to time alignment to UTC.

In many cases other timing references are available to the subordinate clock, such as frequency references derived from physical layer signals such as Synchronous Ethernet (SyncE) transmission links, Synchronous Optical Network (SONET) transmission links, or Synchronous Digital Hierarchy (SDH) transmission links; or timing inputs from an Office Building Integrated Timing Supply (BITS) system that are traceable to a primary reference source (PRS) or primary reference clock (PRC). In such instances, it is advantageous to implement a hybrid subordinate clock with two servo loops (e.g., phase-locked loops), where one servo loop is used to accept the frequency reference and the other servo loop utilizes the physical layer clock as the driver, and disciplines this clock to drive the Time-of-Day counter, that in turn is the source for the time-stamps struck for the time-or-arrival and time-of-departure of the packets involved in the packet-based synchronization of the subordinate clock to its master.

The physical layer clock component of the subordinate clock is not unconstrained. For example, if the subordinate clock is embedded in a device that is part of a physical layer synchronization network such SyncE, SONET, or SDH, then the physical layer clock must satisfy the requirements associated with that architecture. The packet-layer clock must accept this timing signal even if it has not been optimized.

Figure 2:
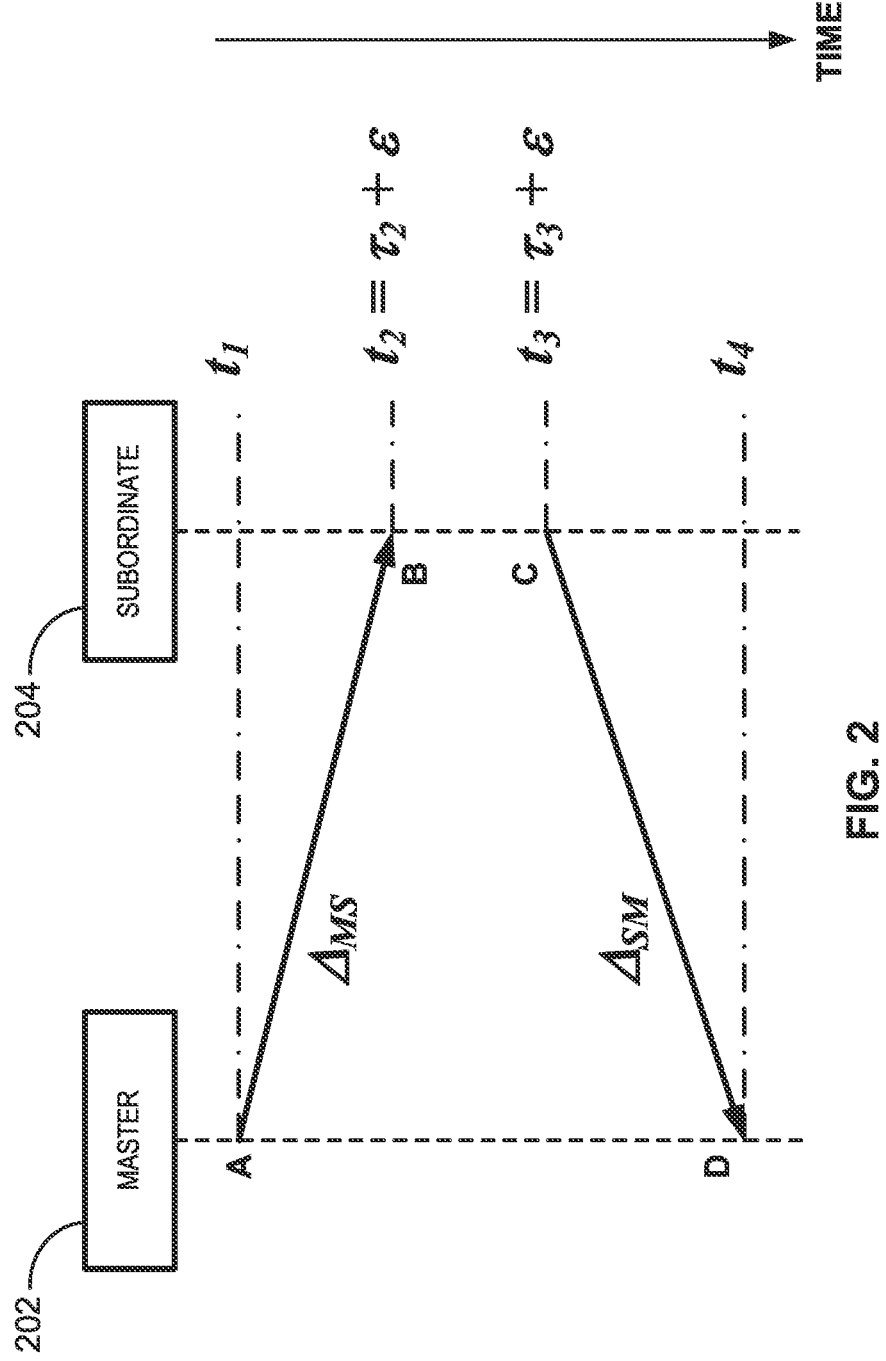
FIG. 2 identifies the time-stamps and events associated with the timing signal suitable for transferring timing from a packet-based master clock to a packet-based subordinate clock, according to aspects of the present disclosure.
Figure 2:

FIG. 1 is a simplified block diagram representing a grandmaster (GM) clock 100 (based on PTP). The GM 100 receives a time input 105, which can be in the form of a 1PPS (one-pulse-per-second) signal together with a message channel indicating the precise time-of-day at the significant event (rising edge or falling edge, depending on convention) of the 1PPS signal. The time and frequency generation is done by a packet-based clock 112 that can be part of a greater packet engine 110. The GM 100 includes a local frequency output 106, and local time outputs 107 and 108. The GM 100, acting as the master, receives the precise time-stamps 114 of incoming and outgoing packets and inserts the appropriate time-stamps into outgoing packets. Time-stamping is performed by a packet-processing block 116 that uses a local clock signal 150 from an oscillator module 125 that is part of a physical layer clock 120. In some implementations, the physical layer clock 120 is synchronized using the 1PPS signal as a 1 Hz reference frequency input. Packets enter the GM 100 via packet input 130A and exit the GM 100 via packet output 130B, which may be formed using traditional packet I/O methods, such as Ethernet. An output providing the physical layer clock 135 is common. The GM 100 provides a timing reference to down-stream subordinate clocks. The manner in which the subordinate clocks align themselves with the master is illustrated in FIG. 2. Packet exchanges between a master 202 (e.g., the GM 100) and a subordinate 204 provide measurements of the transit delay between the two. The particular protocol employed determines the method whereby the measurements ("time-stamps") are communicated between the two entities. This protocol can be, for example, PTP or network time protocol (NTP). Both are supported by packet networks in a transparent fashion.

The sequence of events and important items of information associated with an exchange of packets between master and subordinate includes events A, B, C, and D. Event A includes a first packet being transmitted by the GM 100 with a time of departure of. G-Event B includes the first packet arriving at the subordinate 204 which measures the time of arrival of the packet as $T_2$. If the time of the subordinate 204 is offset from the time of the master 202 by an offset a, the actual time of the arrival of the packet at the subordinate 204 is $t_2 = T_2 + E$. Event C includes a second packet being transmitted by the subordinate 204 that notes the time of departure as $T_3$. Given the offset a between the time of the master 202 and the subordinate 204, the actual time of departure of the second packet from the subordinate 204 is $t_3 = T_3 + a$. Event D includes the second packet arriving at the master 202, which measures the time of arrival as $t_4$.

In PTP, the first packet going from the master 202 to the subordinate 204 (denoted by the arrow from A to B) is called a "Sync Message" and carries the time-stamp T1 whose value is G-Providing the time of departure of a packet in the packet itself is difficult to do precisely. Consequently, in PTP, there is a notion of a "Follow-on Message". The Sync Message contains an approximate value of T1 whereas the precise value of T1, e.g., G, is carried by a Follow-on Message which, as the name implies, is transmitted shortly after the Sync Message. The Follow-on Message is not depicted in FIG. 2 since it is not timed but just carries information (the precise value of T1). The time-stamp struck at the subordinate 204 upon arrival of the Sync Message is called T2 and the value, according to the time clock in the subordinate clock is T2. The second packet going from the subordinate 204 to the master 202 (denoted by the arrow from C to D) is called a "Delay Request" and has a time of departure of T3, which has a value of T3 according to the time clock of the subordinate 204. The master 202 time-stamps the time of arrival of the Delay Request at the master 202, and this time-stamp is called T4 and has the value $t_4$. The master 202 then sends this value back to the subordinate 204 in a Delay Response message. This is not a timed message and is not explicitly shown in FIG. 2. The subordinate 204 thus has the times of arrival and times of departure of all Sync Messages and Delay Request messages, often referred to as the four-tuple (T1, T2, T3, T4).

Such a two-way exchange of packets can provide information suitable for allowing the subordinate 204 to align in time with the master 202. If the exchange of information is only one-way, from the master 202 to the subordinate 204 (referred to as the forward direction), the subordinate 204 can still align its clock (frequency) with the master 202 since the first packet contains the time-of-departure from the master (Zq) and the subordinate 204 measures the time-of-arrival (T2). This alignment process is referred to as syntonization. One-way methods, where the time-stamped packets flow from the subordinate 204 to the master 202 can be employed provided the mechanism is available for the subordinate 204 to obtain the results of the master 202 measuring time of arrival at the master ($t_4$).

There are four measured values that can be communicated between the master 202 and the subordinate 204, namely, $t_1(T_2, T_3, t_4$. Such a two-way exchange involves one packet sent in each direction. These packets do not have to be consecutive, as long as the time stamp information is communicated appropriately. In some instances, the rate at which packets are transmitted in the two directions can be different. Denoting by $A_{MS}$ and $A_{SM}$ as the transit delays from the master 202 to the subordinate 204 and from the subordinate 204 to the master 202 respectively, the following equations (referred to as Eq. 1) can be established: $tq = T_2 + E + ASM$ (for a packet from the master 202 to the subordinate 204); and $t_4 = T_3 + £ + A_{SM}$ (for a packet from the subordinate 204 to the master 202.

In an actual time-transfer situation there are two equations with three unknowns, so it is common to assume reciprocity of transit delay between the two devices, thereby reducing the number of unknowns to two, and therefore computing s, the subordinate time offset from master according to the following equation (referred to as Eq. 2): $s = ^4 +^t_i{}^T3 +^T2) > (t4 - T_3) - (T_2 - t1)/2$.

Because of the fundamental statistical behavior of packet networks, the transit delays are not fixed and can vary from packet to packet. To counter this packet delay variation, as well as to account for any drift in the clock oscillator of the subordinate 204, the estimates of clock offset are made routinely, and it is well known that the mitigation of the deleterious effects of packet delay variation and oscillator drift is improved by using more frequent exchanges of timing packets. Simple subordinate clocks develop their estimate of time offset from master based on (Eq. 2) and use this information to discipline their time-clock in both frequency and time/phase.

Hybrid subordinate clocks utilize the availability of a frequency reference embedded in the transmission fabric of the telecommunication network. Thus, when the transmission is based on Time-Division-Multiplexing (TDM), such as in SONET/SDH (Synchronous Optical NETwork/Synchronous Digital Hierarchy) or Ethernet based on the principles of Synchronous Ethernet (aka "SyncE") a physical layer timing reference (frequency) is available to the device.

Figure 3:
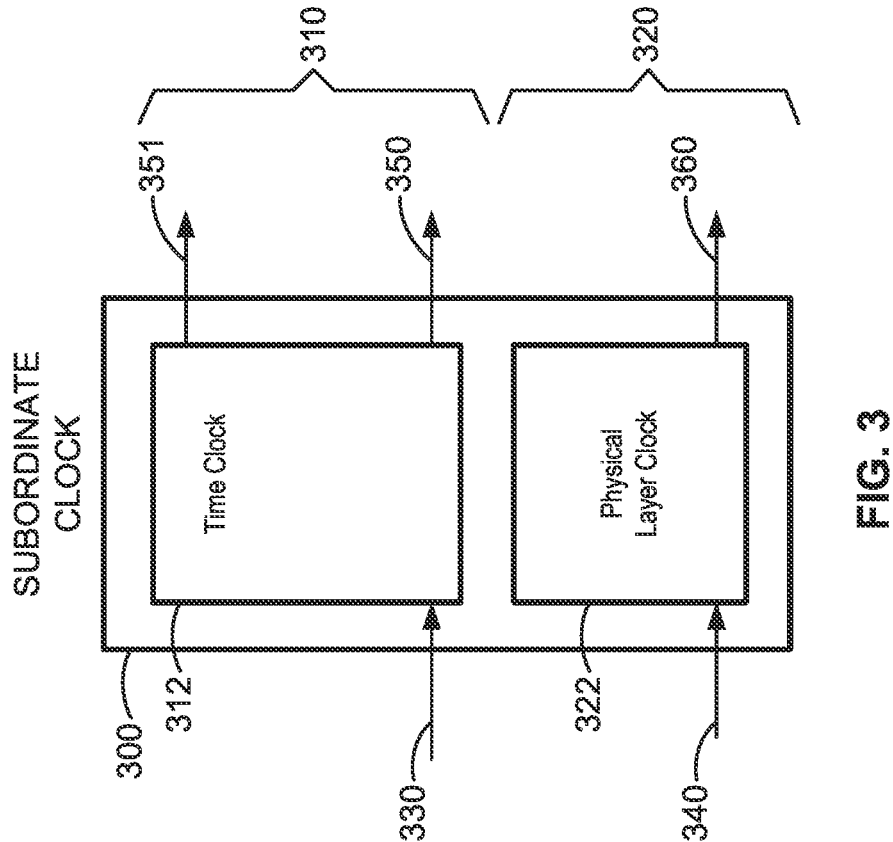
FIG. 3 is a diagram that depicts blocks of a subordinate clock, according to aspects of the present disclosure.

A hybrid subordinate clock 300 is depicted in FIG. 3. The subordinate clock 300 includes a PTP layer 310 and a physical layer 320, which both have servo loop structures. The PTP layer 310 receives a PTP time input 330 (or another packet-based timing reference) and based on the principles described above aligns its time clock 312 with the master. The time clock 312 can generate an 1PPS output 351 (or other timing output) and/or provide a PTP master port and provide a PTP time output 350 to down-stream subordinates. The physical layer (frequency) clock 322 labeled EEC/SEC (for "Ethernet Equipment Clock/Synchronous Equipment Clock) accepts the physical layer frequency input reference 340 and uses PLL means to generate a frequency-synchronized physical layer clock signal 360 that is used in the physical layer transmission (e.g., SyncE). This physical layer clock signal 360 is used as the oscillating signal to drive the PTP layer 310 (e.g., the packet layer) to assist in the packet layer synchronization. This frequency assist provided by the physical layer 320 to the PTP layer 310 is the basis for the term "hybrid" or "assisted" clock.

Figure 4:
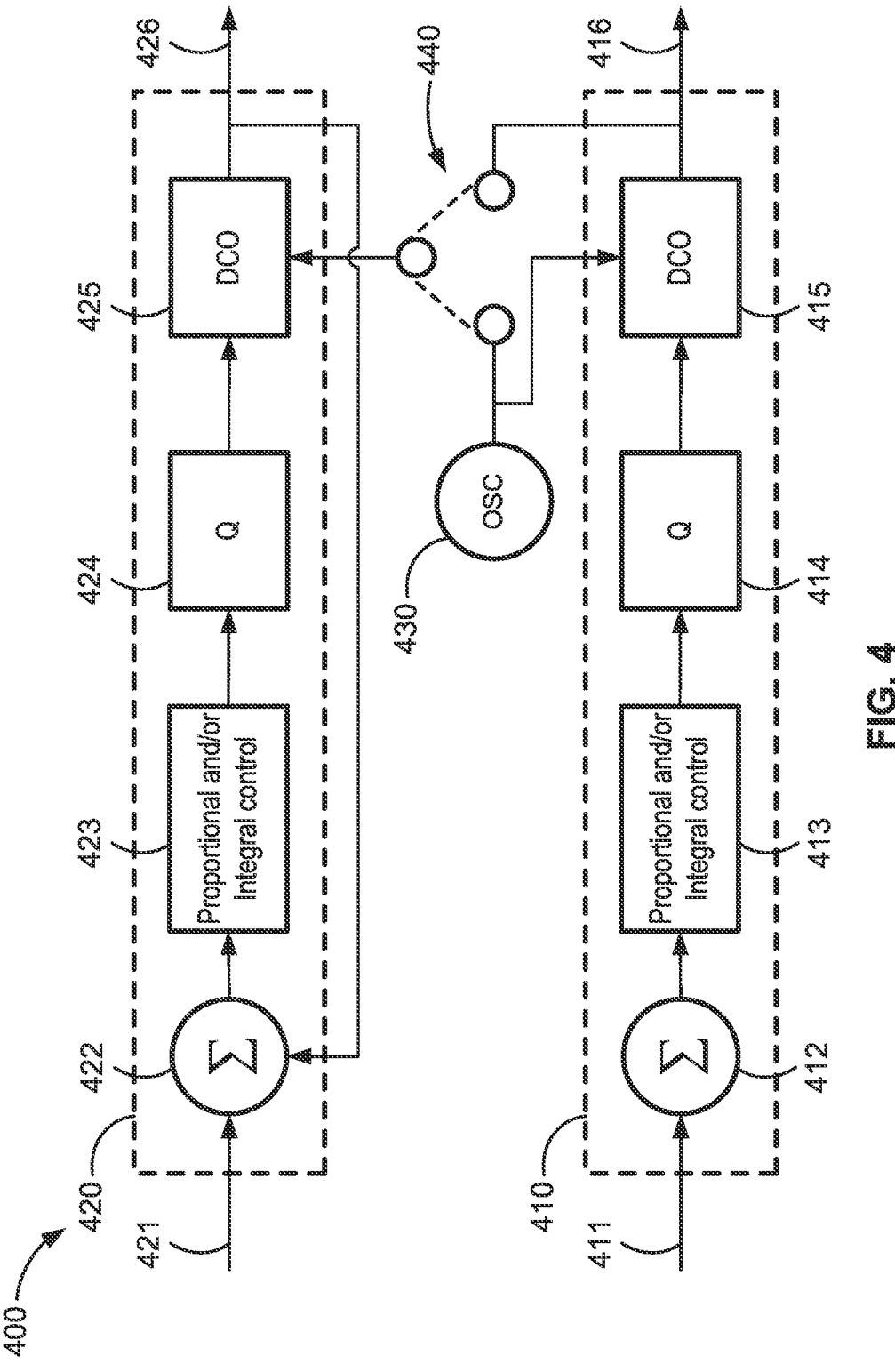
FIG. 4 is a diagram of a two-loop subordinate clock, according to aspects of the present disclosure.

FIG. 4 shows the components of a hybrid subordinate clock 400, which is generally the same as or similar to the subordinate clock 300 of FIG. 3. The PHY loop 410 represents the PLL (phase locked loop) that provides the physical layer clock signal 416. This is achieved by using a digitally controlled oscillator (DCO) 415 for adjusting the frequency of the clock signal originating from the local oscillator 430. Methods and techniques for implementing this DCO function are well known in the field of PLLs. The control signal that is provided to the DCO 415 to implement the frequency adjustment is developed by comparing the generated physical layer clock signal 416 to the input physical layer reference signal 411 using a phase comparator 412. The phase comparator 412 generates the difference, often referred to as "phase error signal" or "error signal" that is processed using servo control techniques (such as proportional control and/or integral control) in the control block 413. In modern devices this processing is done digitally with reasonably large word-lengths in the arithmetic. The block labeled Q 414 represents the restriction of word-length, if necessary, to align with the input word-length requirements of the DCO 415, and can be referred to as a word-length restriction block. The selector 440 permits the choice of either the oscillator 430 itself or the physical layer clock signal 416 as the oscillating signal 427 that is input to a DCO 425 of a PTP loop 420. The PTP loop 420 is also a closed servo loop and is depicted with similar functional blocks as the PHY loop 410. The PTP loop 420 generates a PTP clock signal 426 by adjusting the frequency of the incoming oscillating signal 427 using the DCO 425. The PTP clock signal 426 is used to drive a counter driven, where the counter value represents time. The rate of the PTP clock signal 426 determines the granularity of time that is representable. For example, if the rate is 125 MHz, each clock cycle of the time-stamping clock increments the counter by one unit which is considered, in time units, as 8 ns; a 100 MHz time-stamping clock is associated with a time-granularity of 10 ns, and so on. The higher the rate of the PTP clock signal 426 the more precision is available in the time representation.

The phase comparator 422 represents the development of the "time error" for the PTP loop 420. The PTP reference signal 421 is, in effect, the stream of time-stamps (T1, T2, T3, T4) where the values $t_4$ and $t_4$ are based on the time-clock of the master and $T_2$ and $^{T}3$ based on the time-clock in the DCO 425. The time-error is equivalent to the time offset generated as in Eq. 2. The similarity in pictorial representation of 422 and 412 is solely to indicate that they both generate an error signal based on the reference input and the clock signal of that loop (426 for time and 416 for frequency) suitable for driving the servo control loop that develops the control value for the DCO (425 or 415). In general, the servo loop is used to drive this time error to zero. However, in some implementations, the servo loop is used to drive this time error to a prescribed constant value by adding the prescribed constant value (which may be positive or negative) to the calculated offset.

In summary, FIG. 4 depicts a hybrid subordinate clock 400 that has two servo loops, one for time (PTP loop 420) and one for frequency (PHY loop 410) and it is possible to use the physical layer clock signal 416 as the oscillating mechanism for the PTP loop 420 to achieve the hybrid operation.

Figures 5A, 5B:
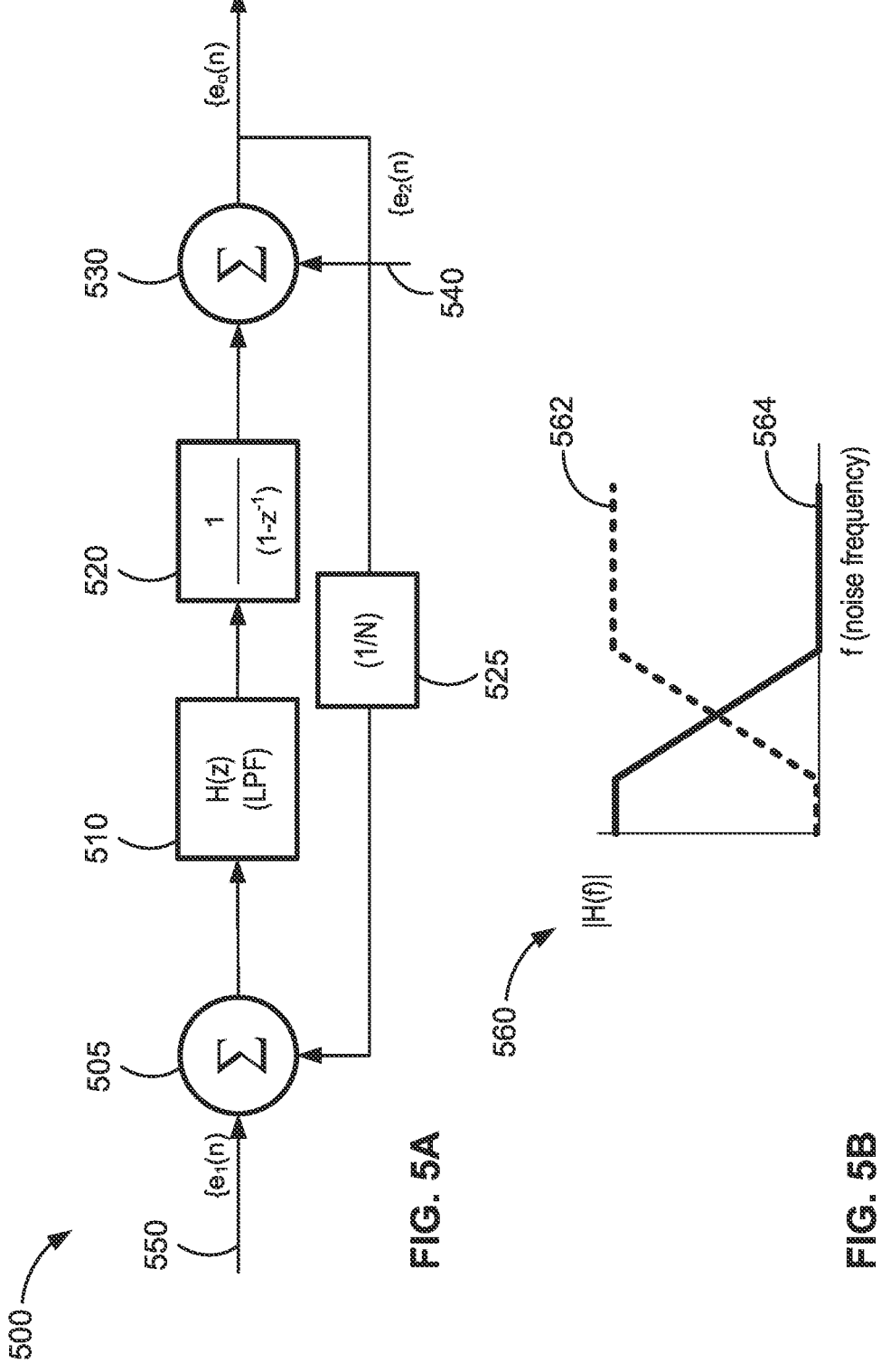
FIG. 5A is a mathematical depiction of a servo loop shows the mathematical operations effectively performed on signals within the servo loop, according to aspects of the present disclosure.
FIG. 5B shows the frequency response characteristics of the servo loop of FIG. 5A, according to aspects of the present disclosure.

The underlying mathematical and signal processing principles of a general phase-locked-loop are depicted in the virtual loop 500 of a PLL in FIG. 5A. When we are in a locked condition, the important signals are the fluctuations, i.e., noise signals (also referred to as "jitter" or "wander"), and the signal processing conditions these fluctuations to minimize the impact in the output. The signal {ei(n)} is the noise in the input reference; {&2(n)} is the noise in the oscillator signal; and {eo(n)} is the noise in the output signal (output clock). This representation of signals is standard in discrete time signal processing, namely, {x( )} is a signal named "x" that is sampled at a given sampling rate and the notion of x(n) is the //-th sample, taken at time instant (nTS) where Ts is the sampling interval that is the reciprocal of the sampling rate fs.

The virtual loop 500 depicted in FIG. 5 assumes that the output rate is N times the rate of the input and hence needs to be divided by N at block 525 in order to implement the phase difference operation at block 505. The digital filter block 510 represents the proportional and integral control filtering, and acts as a low-pass filter (also referred to as an "LPF") on the noise present in the input. It is well known that phase is the integral of frequency and so the model for an oscillator is a digital integrator 520 as shown. The noise in the oscillator is additive to the DCO and is shown as a superposition by the summer 530.

In FIG. 5A, there are two noise signals that are input into the virtual loop 500, noise signal 540 that is present in the oscillator signal and noise signal 550 that is present in the reference input. The effective signal processing that is achieved on noise signal 540 and noise signal 550 is depicted in terms of the frequency response characteristic 560 in FIG. 5B, which measures the attenuation (|H(f)|) versus the frequency of the noise measured in Hz.

Specifically, the noise signal 540 in the oscillator signal experiences a high-pass filter characteristic in its path to the output as shown in the attenuation line 562, whereas the noise signal 550 in the reference input experiences a low-pass filter characteristic in its path to the output as shown in attenuation line 564. Generally speaking, the noise in the input reference tends to be composed of higher frequency components and can be attenuated by the low-pass characteristic and the noise in the oscillator signal tends to be composed of lower frequency components and can be attenuated by the high-pass characteristic. That is why the servo loop is effective in reducing noise.

The high-pass and low-pass characteristics are not independent but have the same 3-dB cut-off frequency. It is common to associate the low-pass behavior with a "time-constant" that is roughly inversely proportional to the cut-off frequency of the low-pass characteristic. Thus, a large time-constant is associated with a narrow-band filter. A narrow-band filter will be effective in attenuating noise in the reference input, but the trade-off is that since the oscillator sees the high-pass version, more oscillator noise will be transferred to the input. It is well known that for very narrow-band loops it is necessary to have very stable oscillators such as oven-controlled crystal oscillators (OCXOs) or temperature-compensated crystal oscillators (TCXOs).

Legacy Synchronous Equipment Clocks (SONET/SDH) and Ethernet Equipment Clocks (SyncE) specified a servo loop bandwidth of between 3 Hz and 10 Hz for the physical layer clock; modem clocks use Enhanced SyncE and require a bandwidth of between 1 Hz and 3 Hz. In contrast, the PTP layer requires a much narrower bandwidth loop. Certain clocks are for packet-based clocks with the nominal packet rate of 16 packets/second (for Sync Messages and Delay Request messages) and a servo loop bandwidth of between 0.05 Hz and 0.1 Hz.

The efficacy of hybrid clocks arises from the use of the SyncE reference as a source of frequency accuracy and of frequency stability. In normal operation, the SyncE reference can be traced back to a Primary Reference Clock (PRC) for its accuracy. The relatively wide-band (between 1 Hz and 10 Hz) servo loops imply that when there is a chain of SyncE physical layer clocks, the oscillators in the clocks do not add much noise and hence the hybrid (subordinate) clock can expect, in normal operation, an accurate, stable, reference input. There may be some high frequency jitter components associated with clock recovery of the physical layer reference but that tends to be removable by the servo loop (cutoff frequency between 1 Hz and 10 Hz). This makes the physical layer clock a very good candidate for providing the oscillating signal to the PTP layer clock.

Figure 6:
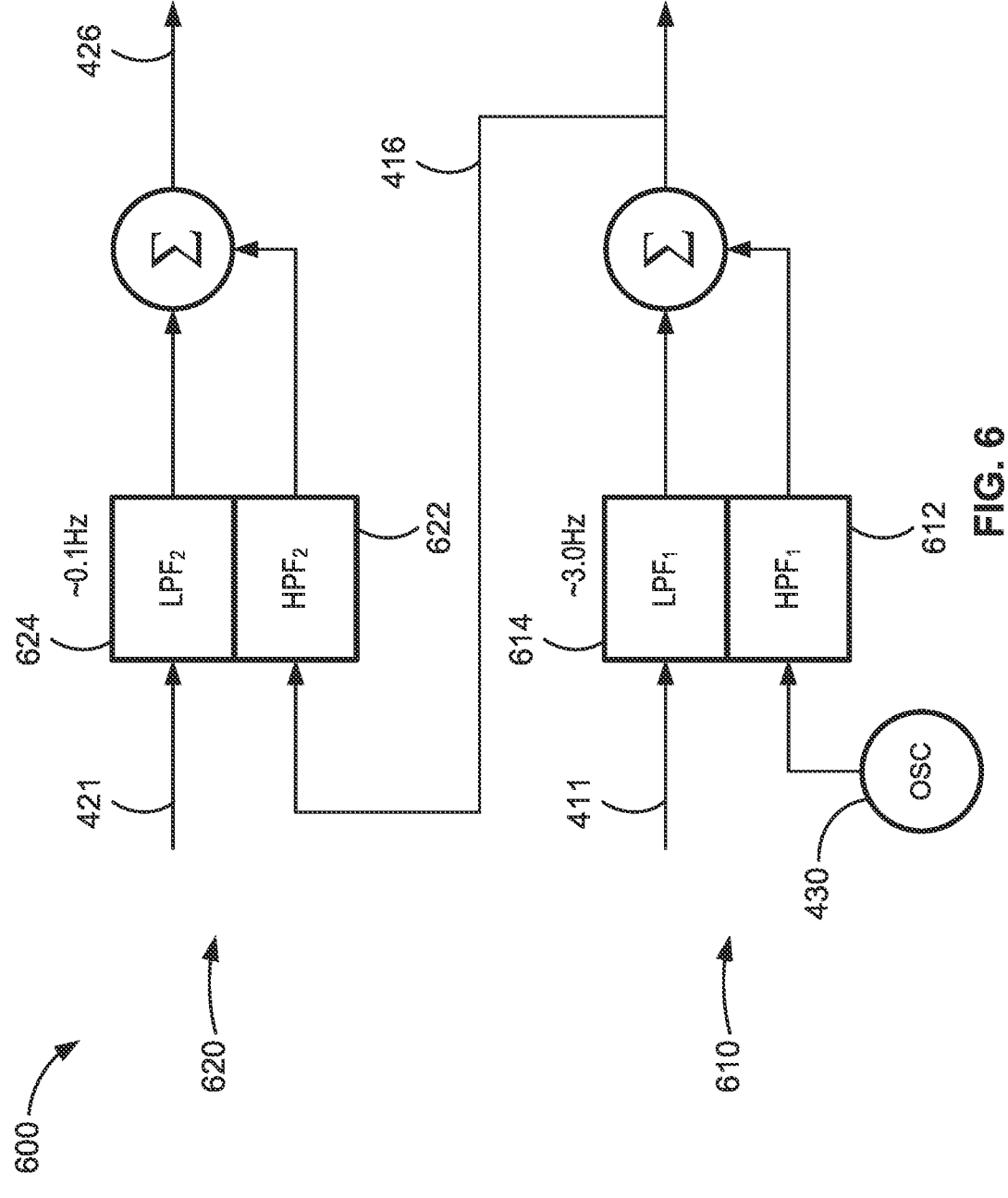
FIG. 6 is a diagram of a virtual loop system showing the filtering results of the subordinate clock of FIG. 4, according to aspects of the present disclosure.

FIG. 6 shows a virtual loop system 600 that models the filter effects of the subordinate clock 400 when the selector directs the physical layer clock signal 416 to the DCO 425 instead of the output of the oscillator 430. Virtual loop 610 represents the PHY loop 410, and is modeled as having a loop bandwidth of 3 Hz. The physical layer reference signal 411 experiences a 3 Hz low-pass filter 614 between input and the physical layer clock signal 416. The oscillator 430 signal experiences a 3 Hz high-pass filter 612 between the oscillator and the physical layer clock signal 416. Virtual loop 620 represents the PTP loop 420, and is modeled as having a loop bandwidth of 0.1 Hz. The PTP reference signal 421 experiences a 0.1 Hz low-pass filter 624 between input and the PTP clock signal 426. The physical layer clock signal 416 experiences a 0.1 Hz high-pass filter 622 between the input and the PTP clock signal 426.

Figure 7A:
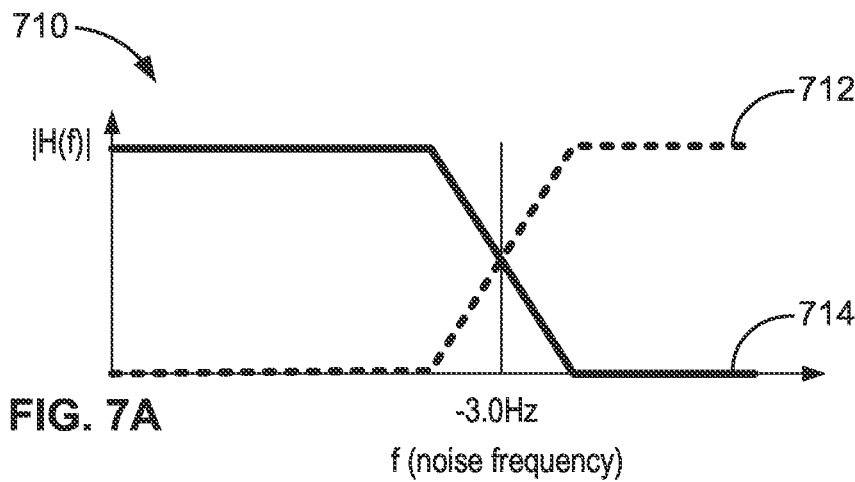
FIG. 7A shows the frequency response characteristics of a first servo loop of the subordinate clock of FIG. 4, according to aspects of the present disclosure.
Figure 7B:
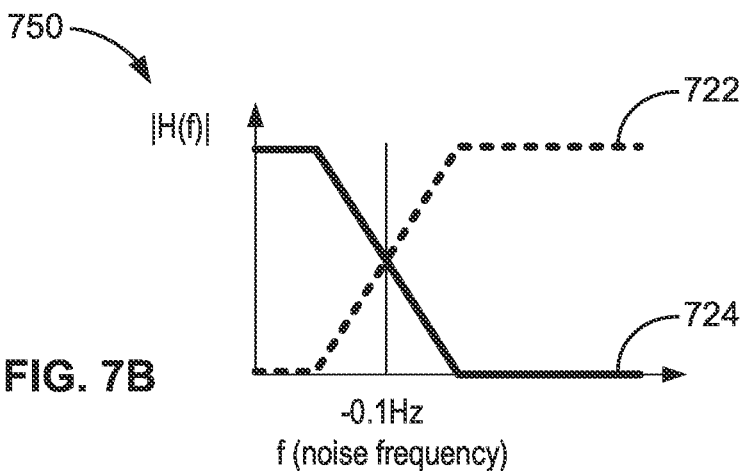
FIG. 7B shows the frequency response characteristics of a second servo loop of the subordinate clock of FIG. 4, according to aspects of the present disclosure.
Figure 7C:
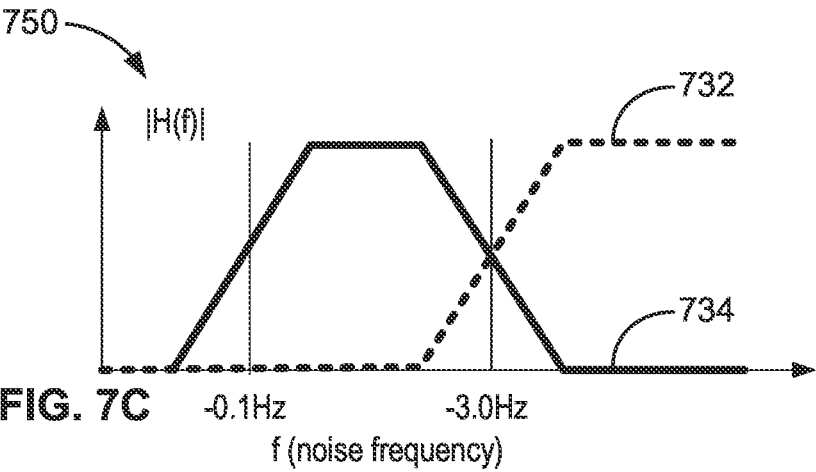

FIGS. 7A-7C show the response characteristics of the subordinate clock 400. Response characteristic 710 shows the attenuation ((H(f)|) in the PHY loop 410 versus the frequency of the noise measured in Hz. Attenuation line 712 shows the attenuation between the oscillator 430 and the output of the physical layer clock signal 416 due to the 3 Hz high-pass filter effect of the PHY loop 410. Attenuation line 714 shows the attenuation between the input of the physical layer reference signal 411 and the output of the physical layer clock signal 416 due to the 3 Hz low-pass filter effect of the PHY loop 410.

Response characteristic 720 shows the attenuation (|H(f)|) in the PTP loop 420 versus the frequency of the noise measured in Hz. Attenuation line 722 shows the attenuation between the oscillator 430 and the output of the PTP clock signal 426 (if SyncE is not enabled) or between the output of the physical layer clock signal 416 and the output of the PTP clock signal 426 (if SyncE is enabled), due to the 0.1 Hz high-pass filter effect of the PTP loop 420. Attenuation line 724 shows the attenuation between the input of the PTP reference signal 421 and the output of the PTP clock signal 426 due to the 0.1 Hz low-pass filter effect of the PTP loop 420.

Response characteristic 730 shows the combined attenuation (|H(f)|) in the PHY loop 410 and the PTP loop 420 versus the frequency of the noise measured in Hz. Attenuation line 732 shows the attenuation between the oscillator 430 and the output of the PTP clock signal 426 due to the combination of the 3 Hz high-pass filter effect of the PHY loop 410 and the 0.1 Hz high-pass filter effect of the PTP loop 420. Attenuation line 734 shows the attenuation between the input of the physical layer reference signal 411 and the output of the PTP clock signal 426. The response characteristic 730 identifies the impact of the dual loop arrangement of the noise (jitter) present in the physical layer reference signal 411 on the PTP clock signal 426 as a band-pass filter with passband range from 0.1 Hz to 3 Hz.

Thus, the dual-loop hybrid clock has numerous advantages. First, the PTP layer is provided an accurate frequency because the SyncE network is timed by a Primary Reference Clock (PRC) that is more accurate than any standalone oscillator. This helps, for example, for "holdover" when there is an interruption in the packet-layer timing reference and the clock has to continue its time-clock based on the provided oscillating signal 427 from the oscillator 430 or the physical layer clock signal 416. Second, the high-pass effect of the PHY loop 410 has a cut-off frequency of the order of 1 Hz to 10 Hz depending on the SyncE clock specification. This permits the utilization of a less expensive oscillator. However, one disadvantage of the dual-loop hybrid clock is that low-frequency wander components present in the physical layer reference signal 411 can be transferred to the PTP clock signal 426 due to the band-pass characteristics resulting from the combination of the PHY loop 410 and the PTP loop 420, shown in the response characteristic 730. This can be substantial during periods of rearrangement in the SyncE network, which are not uncommon.

The enhanced method described here retains the primary advantage of the dual-loop hybrid clock, namely the frequency accuracy of the physical layer reference signal 411. By recognizing that high-performance oscillators are becoming less expensive, the enhanced method utilizes the stability of these high-performance oscillators to overcome the disadvantage of the dual-loop method, namely the instabilities in the physical layer reference input that can be caused by, for example, rearrangements in the SyncE network.

Figure 8:
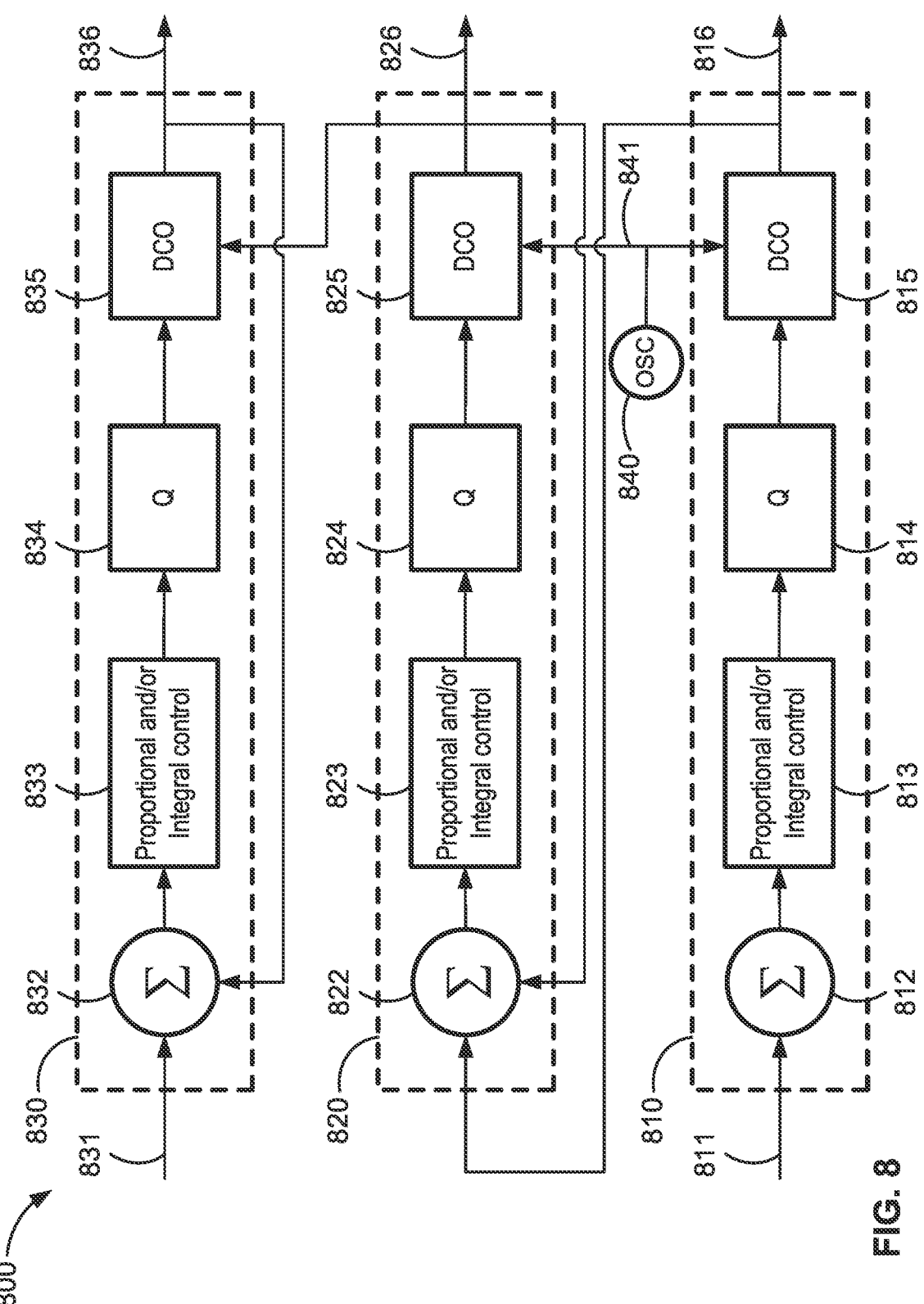
FIG. 8 is a diagram of a three-loop subordinate clock, according to aspects of the present disclosure.

FIG. 8 illustrates a three-loop subordinate clock 800 that includes a first servo loop 810, a second servo loop 820, a third servo loop 830, and an oscillator 840. Each of these servo loops 810-830 can have a phase-locked loop structure (e.g., the output of each loop is fed back into the input, and the input and output are compared to further adjust the output to match the input). The first servo loop 810 is generally the same as the PHY loop 410 of the subordinate clock 400 and can also be referred to as the PHY loop 810. The first servo loop 810 includes a comparator 812 (which may be a phase comparator that is the same as or similar to the phase comparator 412, and determines a phase difference between its two inputs), a control block 813 (the same as or similar to the control block 413), a word-length restriction block 814 (the same as or similar to the word-length restriction block 414), and a digitally controlled oscillator (DCO) 815 (the same as or similar to the DCO 415).

Similarly, the third servo loop 830 is generally the same as the PTP loop 420 of the subordinate clock 400 and can also be referred to as the PTP layer loop 830. The third servo loop 830 includes a comparator 832 (which may be a phase comparator that is the same as or similar to the phase comparator 422, and determines a phase difference between its two inputs), a control block 833 (the same as or similar to the control block 423), a word-length restriction block 834 (the same as or similar to the word-length restriction block 424), and a digitally controlled oscillator (DCO) 835 (the same as or similar to the DCO 425), the output of which is used to generate the local time of the subordinate clock 800 by driving a time-stamping clock, such as the time-stamping clock described herein.

The second servo loop 820 is connected between the first servo loop 810 and the third servo loop 830, and includes a comparator 822 (which may be a phase comparator that is the same as or similar to the phase comparator 412 and/or the phase comparator 422, and determines the phase difference between its two inputs), a control block 823 (the same as or similar to the control block 413), a word-length restriction block 824 (the same as or similar to the word-length restriction block 414), and a digitally controlled oscillator (DCO) 825 (the same as or similar to the DCO 415).

As used herein, the individual components of each of the three servo loops 810, 820, 830 can also be referred to using ordinal numbers. Thus, the subordinate clock 800 can be said to include a first comparator 812, a second comparator 822, and a third comparator 832; a first control block 813, a second control block 823, and a third control block 833; a first word-length restriction block 814, a second word-length restriction block 824, and a third word-length restriction block 834; and a first DCO 815, a second DCO 825, and a third DCO 835.

The first servo loop 810 is electrically connected in the same fashion as the PHY loop 410. The first comparator 812 receives a physical layer reference signal 811 and a physical layer clock signal 816, which is the output of the first DCO 815. The physical layer reference signal 811 is generally the same as the physical layer reference signal 411 and can be any signal with a stable frequency from a system that the subordinate clock 800 is being used with. For example, the physical layer reference signal 811 can be a signal that is generated by a Synchronous Optical Networking (SONET) transmission link, a signal generated by a Synchronous Digital Hierarchy (SDH) transmission link, a signal generated by a Synchronous Ethernet (SyncE) transmission link, a timing input from a Building Integrated Timing Supply (BITS) system, other signals, or any combinations thereof.

The first comparator 812 generates a first error signal that is fed into the first control block 813. The first error signal is associated with the difference (e.g., the phase difference) between the physical layer reference signal 811 and the physical layer clock signal 816 that is output by the first DCO 815. The first control block 813 processes the first error signal and passes it to the first word-length restriction block 814, which performs any necessary restriction of the first error signal as required by the first DCO 815. The first error signal is then fed into the first DCO 815, which also receives an oscillating signal 841 that is generated by the oscillator 840. The first DCO 815 generates the physical layer clock signal 816, which as noted is fed back into the first comparator 812. The physical layer clock signal 816 is the same as or similar to the physical layer clock signal 416 and is a stable clock signal based on the stable frequency of the physical layer reference signal 811. By feeding the physical layer clock signal 816 back into the first comparator 812, the first DCO 815 adjusts the frequency of the oscillating signal 841 to match the frequency of the physical layer reference signal 811, which is output as the physical layer clock signal 816.

The physical layer clock signal 816 is also fed into the second comparator 822 of the second servo loop 820, along with an intermediate clock signal 826, which is the output of the second DCO 825. The second servo loop 820 operates in generally the same fashion as the first servo loop 810. The second comparator 822 generates a second error signal that is associated with the difference (e.g., the phase difference) between the physical layer clock signal 816 and the intermediate clock signal 826, which is then processed by the control block 823 and restricted (if necessary) by the word-length restriction block 824. The second error signal is then fed into the second DCO 825, which also receives the oscillating signal 841 that is generated by the oscillator 840. The second DCO 825 generates the intermediate clock signal 826, which as noted is fed back into the second comparator 822. By feeding the intermediate clock signal 826 back into the second comparator 822, the second DCO 825 adjusts the frequency of the oscillating signal 841 to match the frequency of the physical layer clock signal 816, which is output as the intermediate clock signal 826. Thus, the intermediate clock signal 826 generally has the same frequency as the physical layer clock signal 816, which is based on the stable frequency of the physical layer reference signal 811.

The third servo loop 830 is electrically connected in the same fashion as the PTP loop 420. The third comparator 832 receives a grandmaster reference signal 831 and a final clock signal 836, which is the output of the third DCO 835. The grandmaster reference signal 831 is generally the same as the PTP reference signal 421, and can be generated by a grandmaster clock (also referred to herein as "the grandmaster"), such as the grandmaster clock 100 of FIG. 1. In some implementations, the grandmaster reference signal 831 is a Precision Timing Protocol (PTP) timing input as discussed herein. The grandmaster reference signal 831 is generally associated with the time of the grandmaster.

The third servo loop 830 operates in generally the same fashion as the first servo loop 810 and the second servo loop 820 (and also the same fashion as the PTP loop 420). The third comparator 832 generates a third error signal that is associated with the difference (e.g., the phase difference) between the grandmaster reference signal 831 and the final clock signal 836, which is then processed by the control block 833 and restricted (if necessary) by the wordlength restriction block 834. The phase difference between the grandmaster reference signal 831 and the final clock signal 836 is equivalent to the time difference between the grandmaster time (represented by the grandmaster reference signal 831) and the local time of the subordinate clock 800 (represented by the final clock signal 836). The third error signal is then fed into the third DCO 835, which also receives the intermediate clock signal 826 that is generated by the second DCO 825. The third DCO 835 generates the final clock signal 836, which is associated with the time offset between the grandmaster time and the local time of the subordinate clock 800. By then feeding the final clock signal 836 back into the third comparator 832, the third DCO 835 operates to adjust the frequency of the intermediate clock signal 826 to match the frequency of the grandmaster reference signal 831 such that the time offset between the grandmaster and the subordinate clock 800 (represented by the final clock signal 836) is driven to zero, or to a prescribed constant value by including slight variation as needed. Thus, after the third servo loop 830 has converged, the final clock signal 836 has an average frequency that is generally equal to the average frequency as the grandmaster reference signal 831 and is generated using the stable frequency of the physical layer reference signal 811 via the intermediate clock signal 826 and the physical layer clock signal 816. Thus, the subordinate clock 800 can be used to perform packed-based synchronization. In some implementations, the average frequency of the final clock signal 836 is exactly equal to the average frequency of the grandmaster reference signal 831. In these implementations, while the frequency of the final clock signal 836 at a specific point in time may vary slightly relative to the frequency of the grandmaster reference signal 831, the average frequency of the final clock signal 836 be equal to the average frequency of the grandmaster reference signal 831. However, in other implementations, the average frequency itself of the final clock signal 836 may vary (temporarily or permanently) relative to the average frequency of the grandmaster reference signal 831. As used to describe the average frequencies of the final clock signal 836 and the grandmaster reference signal 831, the term "generally equal" can include exactly equal, within ±1%, within ±2%, within ±3%, within ±4%, within ±5%, within ±6%, within ±7%, within ±8%, within ±9%, within ±10%, within ±1%-5%, within ±5%-10&, within ±1%-10%, or any combinations thereof.

To drive the difference between the grandmaster and the subordinate clock 800 to a non-zero constant value, an additional term is added to the error signal generated by the third comparator 832. This term may be positive or negative depending on whether the subordinate clock 800 is needed to be set ahead of the grandmaster or behind the grandmaster. This term can be added directly after the third error signal is output from the third comparator 832, after the third error signal has been processed by the control block 833, after the third error signal has been processed by the word-length restriction block 834, or any time before the third error signal is input into the third DCO 325.

Figure 9:
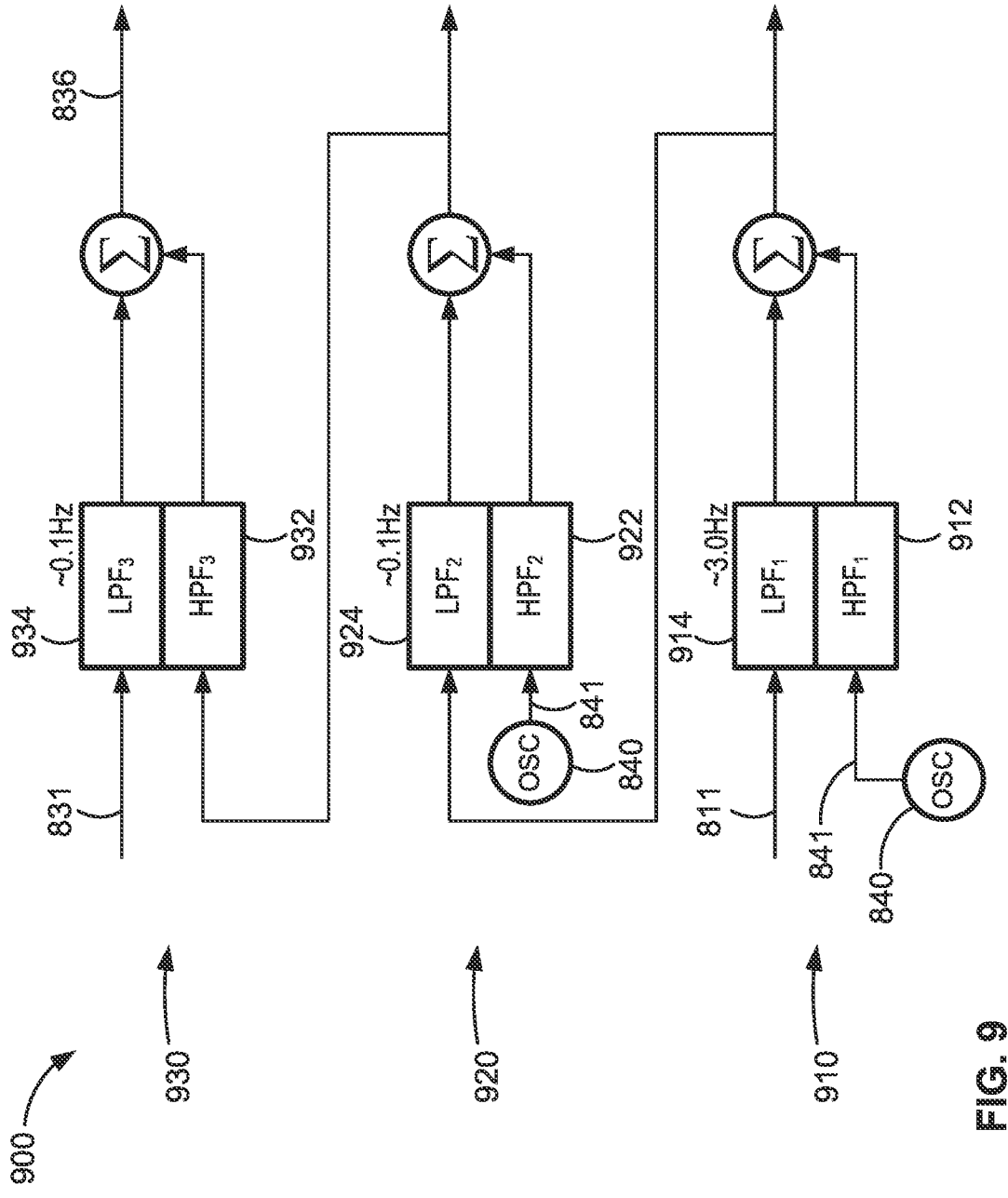
FIG. 9 is a diagram of a virtual loop system showing the filtering results of the subordinate clock of FIG. 8, according to aspects of the present disclosure.

FIG. 9 illustrates a frequency response model 900 of the subordinate clock 800. As shown, the first servo loop 810 is modeled as a first virtual loop 910 that includes a first high-pass filter 912 (HPFi) and a first low-pass filter 914 (LPFi). The second servo loop 820 is modeled as a second virtual loop 920 that includes a second high-pass filter 922 (HPF2) and a second low-pass filter 924 (LPF2). The third servo loop 830 is modeled as a third virtual loop 930 that includes a third high-pass filter 932 (HPF3) and a third low-pass filter 934 (LPF3).

As shown, in its path from the physical layer to the third servo loop 830, the physical layer reference signal 811 passes through the first low-pass filter 914 in the first virtual loop 910, the second low-pass filter 924 in the second virtual loop 920, and the third high-pass filter 932 of the third virtual loop 930. The physical layer reference signal 811 thus passes through two low-pass filters instead of the single low-pass filter 614 that the physical layer reference signal

411 passes through in the virtual loop system 600 of the subordinate clock 400. In its path from the oscillator 840 to the third servo loop 830, the oscillating signal 841 passes through the first high-pass filter 912 and the second high-pass filter 922. Finally, the grandmaster reference signal 831 passes through the third low-pass filter 934. Thus, the physical layer reference signal 811 effectively passes through a band-pass filter formed from the first low-pass filter 914, the second low-pass filter 924, and the third high-pass filter 932. The oscillating signal 841 passes through a dual-stage filter formed from the first high-pass filter 912 and the second high-pass filter 922. By designing the servo loops 810-830 to have certain frequency bandwidths, noise associated with the various signal can be attenuated and/or removed. For example, noise that was otherwise not attenuated and/or removed from the physical layer reference signal 411 is attenuated and/or removed from the physical layer reference signal 811.

The first servo loop 810 attenuates noise associated with the physical layer reference signal 811 that is above the frequency bandwidth of the first servo loop 810, and attenuates noise associated with the oscillating signal 841 that is below the frequency bandwidth of the first servo loop 810. In some implementations, the frequency bandwidth of the first servo loop 810 is between about 1 Hz and about 10 Hz, between about 3 Hz and about 10 Hz, or about 3 Hz. The bandwidth restriction on the first servo loop 810 is imposed by certain standards that specify the behavior of transmission systems such as Synchronous Ethernet (e.g., ITU-T Rec. G.8262, ITU-T Rec. G.8262.1, and others).

The second servo loop 820 attenuates noise associated with the physical layer reference signal 811 that is above the frequency bandwidth of the second servo loop 820, and attenuates noise associated with the oscillating signal 841 that is below the frequency bandwidth of the second servo loop 820. In some implementations, the frequency bandwidth of the second servo loop 820 is between about 0.01 Hz and about 0.1 Hz, about 0.1 Hz, or about 0.01 Hz.

The third servo loop 830 attenuates noise associated with the grandmaster reference signal 831 that is above the frequency bandwidth of the third servo loop 830, and attenuates noise associated with the physical layer reference signal 811 that is below the frequency bandwidth of the third servo loop 830. In some implementations, the frequency bandwidth of the third servo loop 830 is between about 0.05 Hz and about 0.1 Hz, or about 0.1 Hz.

In some implementations, the frequency bandwidth of the first servo loop 810 is about 3 Hz, the frequency bandwidth of the second servo loop 820 is about 0.1 Hz, and the frequency bandwidth of the third servo loop 830 is about 0.1 Hz. In these implementations, the physical layer reference signal 811 is effectively filtered by a bandpass filter where the upper end of the passband is at 0.1 Hz (from the second low-pass filter 924 in the second virtual loop 920), and the lower end of the passband is also at 0.1 Hz (from the third high-pass filter 932 in the third virtual loop 930). If the second servo loop 820 did not exist, then the upper end of the passband would be at 3 Hz (from the first low-pass filter 914), and noise associated with the physical layer reference signal between 0.1 Hz and 3 Hz would not be attenuated and/or removed. Thus, by adding the second servo loop 820 that has a bandwidth that is less than the third servo loop 830, a vast majority of the noise associated with the physical layer reference signal 811 is attenuated and/or removed.

Figure 10A:
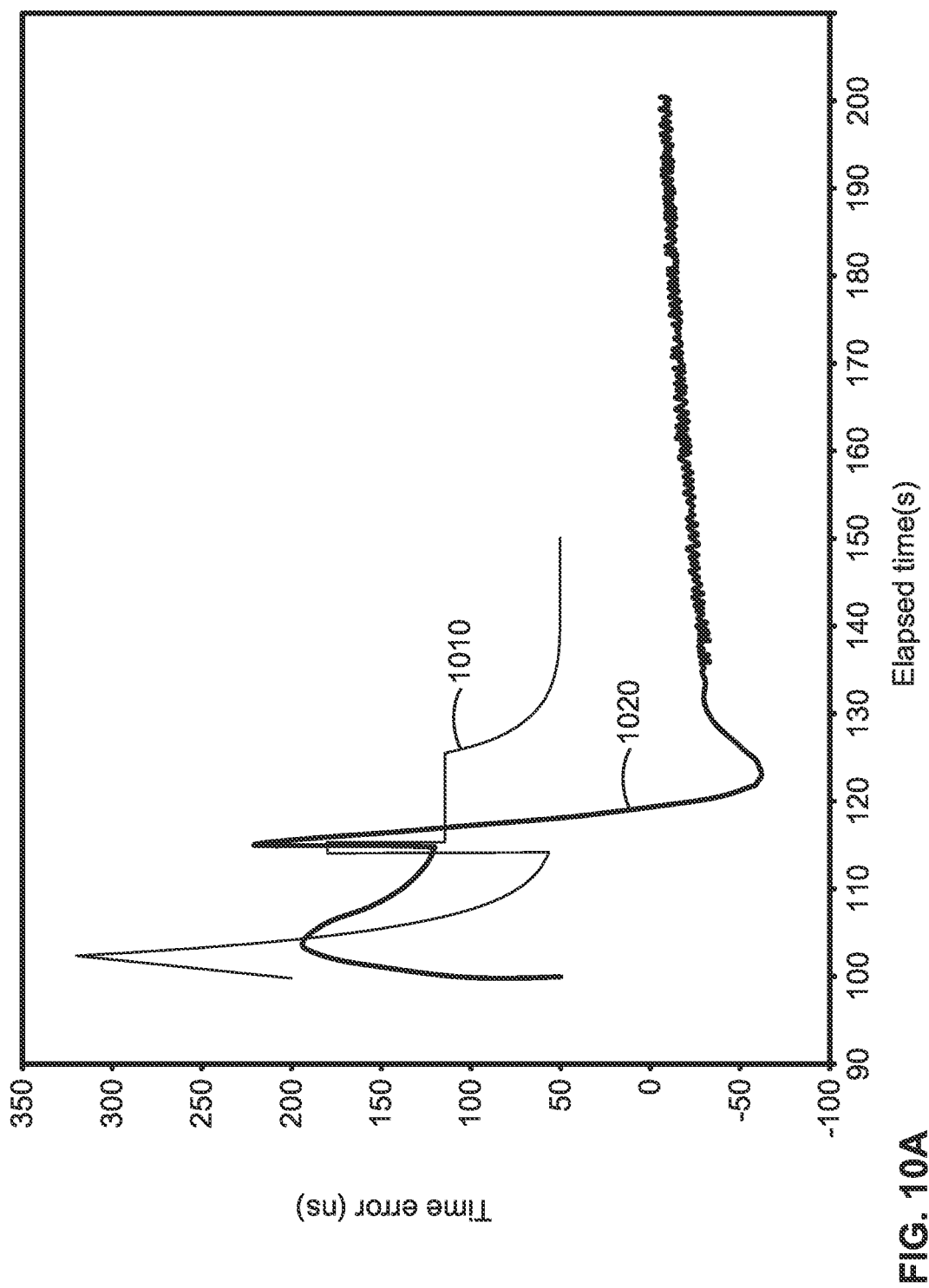
FIG. 10A shows a time error of the two-loop clock of FIG. 4 compared to a mask, according to aspects of the present disclosure.
Figure 10B:
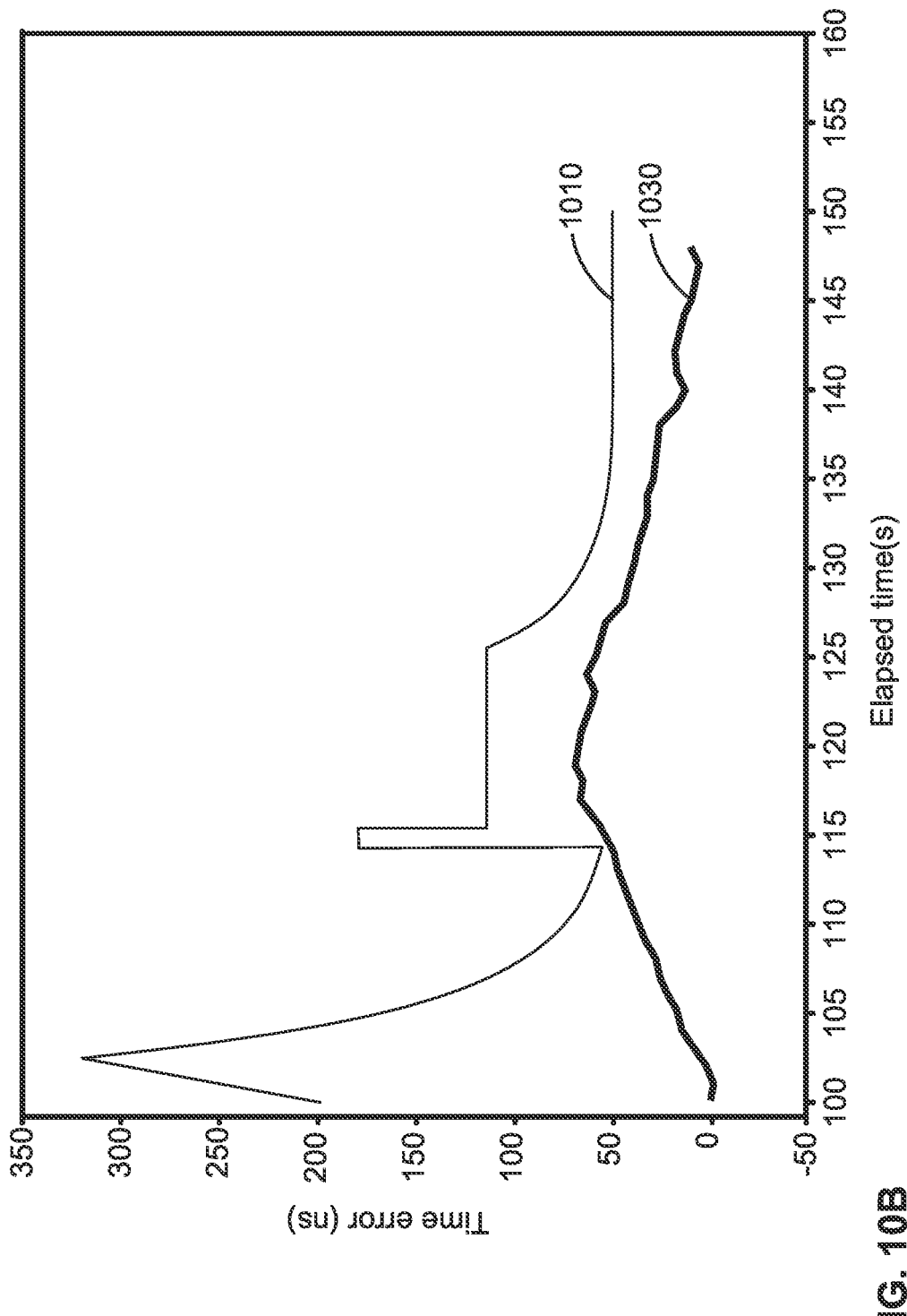
FIG. 10B shows a time error of the three-loop clock of FIG. 8 compared to the mask, according to aspects of the present disclosure.

FIG. 10A shows a plot of the time error 1020 (measured in nanoseconds) versus elapsed time (measured in seconds) of the two-loop subordinate clock 400 compared to a mask 1010, which is effectively a maximum time error allowed when there is a rapid change in the physical layer (under the conditions of the test performed to generate the plot). FIG. 10B shows a plot of the time error 1030 versus elapsed time of the three-loop subordinate clock 800 compared to the same mask 1010. As shown, the time error 1020 of the two-loop subordinate clock 400 violates the mask 1010, whereas the time error 1030 of the three-loop subordinate clock 800 does not violate the mask 1010.

The three-loop subordinate clock 800 can be used in conjunction with a grandmaster clock and a physical layer clock to form a timing system that is relatively immune to any wander or noise in the physical layer clock. As discussed, the grandmaster clock can be configured to generate a PTP timing input signal that forms the grandmaster reference signal 831. The physical clock can be part of any physical layer that may be used, including a SONET transmission link, an SDH transmission link, a SyncE transmission link, a BITS system, and others, which in many instances require the bandwidth of the servo loop that generates the physical layer clock to be between 1.0 Hz and 10.0 Hz.

Various aspects of the present disclosure can be implemented using any suitable combination of hardware and/or software. For example, the subordinate clock 800 can be implemented using PLL-specific integrated circuits that contain various components of the servo loops 810-830. One or more processors (e.g., microcontrollers) can additionally or alternatively be used to perform various functions of the subordinate clock 800 and/or to process any of the various signals that are input into the subordinate clock 800, that are output from the subordinate clock 800, or are propagating within the subordinate clock 800.

ALTERNATIVE IMPLEMENTATIONS

Alternative Implementation 1. A subordinate clock comprising: a first servo loop containing a first digitally controlled oscillator (DCO), the first DCO configured to receive (i) a first error signal that is associated with a physical layer reference signal and (ii) an oscillating signal, and to output a physical layer clock signal; a second servo loop containing a second DCO, the second DCO configured to receive (i) a second error signal associated with the physical layer clock signal and (ii) the oscillating signal, and to output an intermediate clock signal; and a third servo loop containing a third DCO, the third DCO configured to receive (i) a third error signal associated with a grandmaster reference signal generated by a grandmaster clock and (ii) the intermediate clock signal, and to output a final clock signal, wherein an average frequency of the final clock signal is equal to an average frequency of the grandmaster reference signal.

Alternative Implementation 2. The subordinate clock of claim 1, wherein each of the servo loops has a phase-locked loop structure.

Alternative Implementation 3. The subordinate clock of claim 1, wherein the first servo loop includes a first comparator configured to receive (i) the physical layer reference signal and (ii) the physical layer clock signal from the first DCO, and to output the first error signal.

Alternative Implementation 4. The subordinate clock of claim 3, wherein the first error signal is associated with a difference between the physical layer reference signal and the physical layer clock signal.

Alternative Implementation 5. The subordinate clock of claim 3, wherein the second servo loop includes a second comparator configured to receive (i) the physical layer clock signal and (ii) the intermediate clock signal from the second DCO, and to output the second error signal.

Alternative Implementation 6. The subordinate clock of claim 5, wherein the second error signal is associated with a difference between the physical layer clock signal and the intermediate clock signal.

Alternative Implementation 7. The subordinate clock of claim 5, wherein the third servo loop includes a third comparator configured to receive (i) the grandmaster reference signal and (ii) the final clock signal from the third DCO, and to output the third error signal.

Alternative Implementation 8. The subordinate clock of claim 7, wherein the third error signal is indicative of an offset between a time of the grandmaster clock and a time of the subordinate clock.

Alternative Implementation 9. The subordinate clock of claim 1, wherein the first servo loop has a frequency bandwidth and (i) attenuates noise associated with the physical layer reference signal that is above the frequency bandwidth of the first servo loop, and (ii) attenuates noise associated with the oscillating signal that is below the frequency bandwidth of the first servo loop.

Alternative Implementation 10. The subordinate clock of claim 9, wherein the frequency bandwidth of the first servo loop is between about 1 Hz and about 10 Hz, between about 3 Hz and about 10 Hz, or about 3 Hz. Alternative Implementation 11. The subordinate clock of claim 9, wherein the second servo loop has a frequency bandwidth and (i) attenuates the noise associated with the physical layer reference signal that is above the frequency bandwidth of the second servo loop, and (ii) attenuates the noise associated with the oscillating signal that is below the frequency bandwidth of the second servo loop.

Alternative Implementation 12. The subordinate clock of claim 11, wherein the frequency bandwidth of the second servo loop is between about 0.01 Hz and about 0.1 Hz, about 0.1 Hz, or about 0.01 Hz.

Alternative Implementation 13. The subordinate clock of claim 11, wherein the third servo loop has a frequency bandwidth and (i) attenuates noise associated with the grandmaster reference signal that is above the frequency bandwidth of the third servo loop, and (ii) attenuates the noise associated with the physical layer reference signal that is below the frequency bandwidth of the third servo loop.

Alternative Implementation 14. The subordinate clock of claim 9, wherein the frequency bandwidth of the third servo loop is between about 0.05 Hz and about 0.1 Hz or about 0.1 Hz.

Alternative Implementation 15. The subordinate clock of claim 1, wherein the physical layer reference signal is a signal generated by a Synchronous Optical Networking (SONET) transmission link, a signal generated by a Synchronous Digital Hierarchy (SDH) transmission link, a signal generated by a Synchronous Ethernet (SyncE) transmission link, or a timing input from a Building Integrated Timing Supply (BITS) system, and wherein the grandmaster reference signal is Precision Time Protocol (PTP) timing input signal.

Alternative Implementation 16. The subordinate clock of claim 1, wherein the third servo loop operates to drive an offset between a time of the subordinate clock and a time of the grandmaster clock to zero or to a prescribed constant value.

Alternative Implementation 17. A timing system comprising: a grandmaster clock configured to generate a grandmaster reference signal associated with a time of the grandmaster clock; a physical layer configured to generate a physical layer reference signal associated with a frequency of the physical layer; and a subordinate clock including: a first servo loop containing a first digitally controlled oscillator (DCO), the first DCO configured to receive (i) a first error signal that is associated with the physical layer reference signal and (ii) an oscillating signal, and to output a physical layer clock signal; a second servo loop containing a second DCO, the second DCO configured to receive (i) a second error signal associated with the physical layer clock signal and (ii) the oscillating signal, and to output an intermediate clock signal; and a third servo loop containing a third DCO, the third DCO configured to receive (i) a third error signal associated with the grandmaster reference signal from the grandmaster clock and (ii) the intermediate clock signal, and to output a final clock signal, wherein an average frequency of the final clock signal is equal to an average frequency of the grandmaster reference signal.

Alternative Implementation 18. The timing system of claim 17, wherein the second servo loop attenuates noise associated with the physical layer reference signal that is above a frequency bandwidth of the second servo loop, the frequency bandwidth of the second servo loop being between about 0.01 Hz and about 0.1 Hz.

Alternative Implementation 19. The timing system of claim 17, wherein the first servo loop has a frequency bandwidth of between about 1 Hz, and about 10 Hz, and (i) attenuates noise associated with the physical layer reference signal that is above the frequency bandwidth of the first servo loop, and (ii) attenuates noise associated with the oscillating signal that is below the frequency bandwidth of the first servo loop.

Alternative Implementation 20. The timing system of claim 17, wherein the second servo loop has a frequency bandwidth of between about 0.01 Hz and about 0.1 Hz, and (i) attenuates the noise associated with the physical layer reference signal that is above the frequency bandwidth of the second servo loop, and (ii) attenuates the noise associated with the oscillating signal that is below the frequency bandwidth of the second servo loop.

Alternative Implementation 21. The timing system of claim 17, wherein the third servo loop has a frequency bandwidth of between about 0.05 Hz and about 0.1 Hz, and (i) attenuates noise associated with the grandmaster reference signal that is above the frequency bandwidth of the third servo loop, and (ii) attenuates the noise associated with the physical layer reference signal that is below the frequency bandwidth of the third servo loop.

Alternative Implementation 22. The timing system of claim 17, wherein the third servo loop operates to drive an offset between a time of the subordinate clock and a time of the grandmaster clock to zero or to a prescribed constant value.

One or more elements or aspects or steps, or any portion(s) thereof, from one or more of any of the Alternative Implementations and/or claims herein can be combined with one or more elements or aspects or steps, or any portion(s) thereof, from one or more of any of the other Alternative Implementations and/or claims herein or combinations thereof, to form one or more additional implementations and/or claims of the present disclosure.

While the present disclosure has been described with reference to one or more particular embodiments or implementations, those skilled in the art will recognize that many changes 1 may be made thereto without departing from the spirit and scope of the present disclosure. Each of these implementations and obvious variations thereof is contemplated as falling within the spirit and scope of the present disclosure. It is also contemplated that additional implementations according to aspects of the present disclosure may combine any number of features from any of the implementations described herein.

What is claimed is:

1. A subordinate clock comprising:
a first servo loop containing a first digitally controlled oscillator (DCO), the first DCO configured to receive (i) a first error signal that is associated with a physical layer reference signal and (ii) an oscillating signal, and to output a physical layer clock signal;
a second servo loop containing a second DCO, the second DCO configured to receive (i) a second error signal associated with the physical layer clock signal and (ii) the oscillating signal, and to output an intermediate clock signal; and
a third servo loop containing a third DCO, the third DCO configured to receive (i) a third error signal associated with a grandmaster reference signal generated by a grandmaster clock and (ii) the intermediate clock signal, and to output a final clock signal,
wherein an average frequency of the final clock signal is generally equal to an average frequency of the grandmaster reference signal.

2. The subordinate clock of claim 1, wherein each of the servo loops has a phase-locked loop structure.

3. The subordinate clock of claim 1, wherein the first servo loop includes a first comparator configured to receive (i) the physical layer reference signal and (ii) the physical layer clock signal from the first DCO, and to output the first error signal.

4. The subordinate clock of claim 3, wherein the first error signal is associated with a difference between the physical layer reference signal and the physical layer clock signal.

5. The subordinate clock of claim 3, wherein the second servo loop includes a second comparator configured to receive (i) the physical layer clock signal and (ii) the intermediate clock signal from the second DCO, and to output the second error signal.

6. The subordinate clock of claim 5, wherein the second error signal is associated with a difference between the physical layer clock signal and the intermediate clock signal.

7. The subordinate clock of claim 5, wherein the third servo loop includes a third comparator configured to receive (i) the grandmaster reference signal and (ii) the final clock signal from the third DCO, and to output the third error signal.

8. The subordinate clock of claim 7, wherein the third error signal is indicative of an offset between a time of the grandmaster clock and a time of the subordinate clock.

9. The subordinate clock of claim 1, wherein the first servo loop has a frequency bandwidth and (i) attenuates noise associated with the physical layer reference signal that is above the frequency bandwidth of the first servo loop, and (ii) attenuates noise associated with the oscillating signal that is below the frequency bandwidth of the first servo loop.

10. The subordinate clock of claim 9, wherein the frequency bandwidth of the first servo loop is between about 1 Hz and about 10 Hz, between about 3 Hz and about 10 Hz, or about 3 Hz.

11. The subordinate clock of claim 9, wherein the second servo loop has a frequency bandwidth and (i) attenuates the noise associated with the physical layer reference signal that is above the frequency bandwidth of the second servo loop, and (ii) attenuates the noise associated with the oscillating signal that is below the frequency bandwidth of the second servo loop.

12. The subordinate clock of claim 11, wherein the frequency bandwidth of the second servo loop is between about 0.01 Hz and about 0.1 Hz, about 0.1 Hz, or about 0.01 Hz.

13. The subordinate clock of claim 11, wherein the third servo loop has a frequency bandwidth and (i) attenuates noise associated with the grandmaster reference signal that is above the frequency bandwidth of the third servo loop, and (ii) attenuates the noise associated with the physical layer reference signal that is below the frequency bandwidth of the third servo loop.

14. The subordinate clock of claim 9, wherein the frequency bandwidth of the third servo loop is between about 0.05 Hz and about 0.1 Hz or about 0.1 Hz.

15. The subordinate clock of claim 1, wherein the physical layer reference signal is a signal generated by a Synchronous Optical Networking (SONET) transmission link, a signal generated by a Synchronous Digital Hierarchy (SDH) transmission link, a signal generated by a Synchronous Ethernet (SyncE) transmission link, or a timing input from a Building Integrated Timing Supply (BITS) system, and wherein the grandmaster reference signal is Precision Time Protocol (PTP) timing input signal.

16. The subordinate clock of claim 1, wherein the third servo loop operates to drive an offset between a time of the subordinate clock and a time of the grandmaster clock to zero or to a prescribed constant value.

17. A timing system comprising:
a grandmaster clock configured to generate a grandmaster reference signal associated with a time of the grandmaster clock;
a physical layer configured to generate a physical layer reference signal associated with a frequency of the physical layer; and
a subordinate clock including:
a first servo loop containing a first digitally controlled oscillator (DCO), the first DCO configured to receive (i) a first error signal that is associated with the physical layer reference signal and (ii) an oscillating signal, and to output a physical layer clock signal;
a second servo loop containing a second DCO, the second DCO configured to receive (i) a second error signal associated with the physical layer clock signal and (ii) the oscillating signal, and to output an intermediate clock signal; and
a third servo loop containing a third DCO, the third DCO configured to receive (i) a third error signal associated with the grandmaster reference signal from the grandmaster clock and (ii) the intermediate clock signal, and to output a final clock signal,
wherein an average frequency of the final clock signal is generally equal to an average frequency of the grandmaster reference signal.

18. The timing system of claim 17, wherein the second servo loop attenuates noise associated with the physical layer reference signal that is above a frequency bandwidth of the second servo loop, the frequency bandwidth of the second servo loop being between about 0.01 Hz and about 0.1 Hz.

19. The timing system of claim 17, wherein the first servo loop has a frequency bandwidth of between about 1 Hz, and about 10 Hz, and (i) attenuates noise associated with the physical layer reference signal that is above the frequency bandwidth of the first servo loop, and (ii) attenuates noise associated with the oscillating signal that is below the frequency bandwidth of the first servo loop.

20. The timing system of claim 17, wherein the second servo loop has a frequency bandwidth of between about 0.01 Hz and about 0.1 Hz, and (i) attenuates the noise associated with the physical layer reference signal that is above the frequency bandwidth of the second servo loop, and (ii) attenuates the noise associated with the oscillating signal that is below the frequency bandwidth of the second servo loop.

21. The timing system of claim 17, wherein the third servo loop has a frequency bandwidth of between about 0.05 Hz and about 0.1 Hz, and (i) attenuates noise associated with the grandmaster reference signal that is above the frequency bandwidth of the third servo loop, and (ii) attenuates the noise associated with the physical layer reference signal that is below the frequency bandwidth of the third servo loop.

22. The timing system of claim 17, wherein the third servo loop operates to drive an offset between a time of the subordinate clock and a time of the grandmaster clock to zero or to a prescribed constant value.

* * * * *